(12) United States Patent
Abe

(10) Patent No.: US 6,212,648 B1
(45) Date of Patent: Apr. 3, 2001

(54) MEMORY MODULE HAVING RANDOM ACCESS MEMORIES WITH DEFECTIVE ADDRESSES

(75) Inventor: Kazuhiko Abe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/102,638

(22) Filed: Jun. 23, 1998

(30) Foreign Application Priority Data

Jun. 25, 1997 (JP) .................................................. 9-169222

(51) Int. Cl.[7] ..................................................... G06F 11/00
(52) U.S. Cl. ................................................. 714/8; 714/53
(58) Field of Search ............................ 714/8, 9, 53, 723; 710/26, 28; 711/2, 5; 365/200, 201

(56) References Cited

U.S. PATENT DOCUMENTS 5,758,056 * 5/1998 Barr ................................. 395/182.05
5,996,096 * 11/1999 Dell et al. ............................. 714/710

* cited by examiner

Primary Examiner—Robert Beausoleil
Assistant Examiner—Scott T. Baderman
(74) Attorney, Agent, or Firm—Young & Thompson

(57) ABSTRACT

The present invention provides a memory module having connective terminals and a plurality of random access memories connected through a first set of interconnections to the connective terminals. At least one of the random access memories has at least one defective address. The memory module further has a storage device connected through a second set of interconnections to the connective terminals for storing an information of the at least one defective address so as to allow a processing unit to fetch the information of the at least one defective address from the storage device so that the processing unit is operated to inhibit an access to the at least one defective address.

10 Claims, 3 Drawing Sheets

MEMORY MODULE HAVING RANDOM ACCESS MEMORIES WITH DEFECTIVE ADDRESSES

BACKGROUND OF THE INVENTION

The present invention relates to a memory module, and more particularly to a memory module which is available even if the memory module has a plurality of random access memories, at least one of which has at least a defective address.

In recent years, the requirement for increase in capacity of memory in electronic devices such as personal computers has been on the increase. The memory devices are, however, limited in size and required to have an extensibility, in the light of which it is not preferable to mount random access memories particularly dynamic random access memories on a board of a computer. In place, it has been often carried out to mount the random access memories on a multi-layer printed circuit board with connective terminals to form a memory module so that a plurality of such memory modules are inserted into sockets on a mother board of the computer. This means that it is required to provide only sockets on the mother board for the memory modules. Each of the multi-layer printed circuit boards extends in a vertical direction to the plane mother board and a plurality of the random access memories are provided on each of the multilayer printed circuit boards. The vertically extending multilayer printed circuit boards, on each of which a plurality of the random access memories are provided, are provided on the mother board of the computers. This means that the random access memories are accommodated in a three dimensional space over the mother board of the computer. The use of the three dimensional space for providing the random access memories reduces the necessary area of the mother board of the computer. This allows a compact size of the computer. The provision of the random access memories in the form of the plural memory modules ensures a high extensibility since the individual memory modules are easily attached into and detached from the sockets on the mother board of the computer.

FIG. 1 is a front view illustrative of a conventional multilayer printed circuit board on which eight dynamic random access memories are mounted along with a single electrically erasable programmable read only memory.

The conventional multilayer printed circuit board 31 has a bottom side on which connective terminals are provided so that the conventional multilayer printed circuit board 31 are electrically and mechanically connected to the mother board through sockets on the mother board. Eight dynamic random access memories 33 are mounted to be aligned in a lateral and longitudinal direction of the multilayer printed circuit board 31. The individual eight dynamic random access memories 33 are electrically connected through a first set of interconnections 32-1 to the connective terminals 35. A single electrically erasable programmable read only memory 34 is also mounted on a side portion of the multilayer printed circuit board 31. The single electrically erasable programmable read only memory 34 is electrically connected through a second set of interconnections 32-2 to the connective terminals 35.

The individual dynamic random access memories 33 have a 64 M-bits size of 8 M-words×8-bits. The individual memory module has eight dynamic random access memories 33. Thus, the individual memory module is in the form of 8 M-words×64 M-bits size.

In JEDEC (Joint Electron Device Engineering Council), there has been known a memory module on which a 2 k-bit serial electrically erasable programmable read only memory is mounted for storing configurations and characteristics of the module.

In recent years, the prices of the random access memories have been reduced whilst the capacity of the memory has been increased. For this reason, the dynamic random access memories are used to store large amounts of informations in place of the conventionally used magnetic disk memory. In this field, the random access memories have recently been about to be used in the form of the memory modules.

The memory modules may be classified into two types. The first type is an error correct code type memory module capable of detecting any defect during operation and also possessing bits for correcting the defects, The second type is a non-error correct code type memory module incapable of correcting any defects even the defects appear in operation. For the non-error correct code type memory module, just 64-bits data-bus width is required without any extra bits. For example, it is possible to realize the non-error correct code type memory module by use of eight of 8-bits dynamic random access memories. By contrast, in accordance with the error correct code type memory module, the error correct code requires further 8-bits. This means that the error correct code type memory module requires not only the 64-hits bus but also the additional 8-bits for error correct code. Namely, nine 8-bits dynamic random, access memories are required to be mounted on each memory module. The error correct code type memory module needs to use at least one additional dynamic random access memory to the basic 64-bits bus necessary for the non-error correct code type memory module. For this reason, the error correct code type memory module is somewhat expensive as compared to the non-error correct code type memory module.

In general, immediately after the power-on of the computer, an operating system stored in a magnetic disk memory is transferred into a random access memory so that a central processing unit utilizes data of the transferred operating system for operations. If, however, any defect exists in the random access memory to which the operating system is to be transferred, it is impossible to store the exact programs of the operating system into the defective random access memory. As a result; the central processing unit is inoperable. This means that all of the random access memories to be mounted on such the memory module for this purpose are absolutely required to be complete.

If, however, the random access memories having a few bits of defective addresses are used for storing voices to use an audio device, there is raised substantially no problem in use of the random access memories. Of course, the random access memory having the defective address is cheaper than the random access memory free of any defective address. For those reasons, it is preferable to use the cheaper random access memories with the defective address.

Actually, the unit price for one bit of the random access memory has been on the drop due to increase in capacity of the memory. If, however, there is any defective address which is hard to be relieved by a redundancy circuit, then this random access memory would be unusable. If, for example, the 64 M-bits dynamic random access memory has 67,108,863 bits effective memory cells and only one bit defective memory cell, then the 64 M-bits dynamic random access memory is likely to be disposed.

Namely, in the cost case, only the complete random access memories are mounted on the memory module, for which reason the memory module tends to still be expensive.

Further, the yield of the random access memories is low, for which reason the unit price of the random access memories is likely to be expensive.

In the above circumstances, it had been required to develop a novel memory module free from the above problems and disadvantages.

SUMMARY OF THE INVENTION

Accordingly, it is an object of the present invention to provide a novel memory module free from the above problems.

It is a further object of the present invention to provide a novel memory module which is operable even at least one of random access memories mounted on the memory module includes at least one defective address.

It is a still further object of the present invention to provide a novel memory module which is cheaper than the conventional memory module.

The above and other objects, features and advantages of the present invention will be apparent from the following descriptions.

The present invention provides a memory module having connective terminals and a plurality of random access memories connected through a first set of interconnections to the connective terminals. At least one of the random access memories has at least one defective address. The memory module further has a storage device connected through a second set of interconnections to the connective terminals for storing an information of the at least one defective address so as to allow a processing unit to fetch the information of the at least one defective address from the storage device so that the processing unit is operated to inhibit an access to the at least one defective address.

It is preferable that the storage device comprises a non-volatile memory. In this case, it is further preferable that the non-volatile memory comprises an electrically erasable programmable read only memory.

It is preferable that the storage device comprises a volatile memory and a battery electrically connected to the volatile memory for allowing the volatile memory to hold the information of the at least one defective address with a power supplied form the battery.

It is also preferable that the random access memory comprises a dynamic random access memory.

It is also preferable that the random access memory comprises a static random access memory.

BRIEF DESCRIPTION OF THE DRAWINGS

Preferred embodiments according to the present invention will be described in detail with reference to the accompanying drawings.

PREFERRED EMBODIMENTS

FIRST EMBODIMENT

Figure 1:
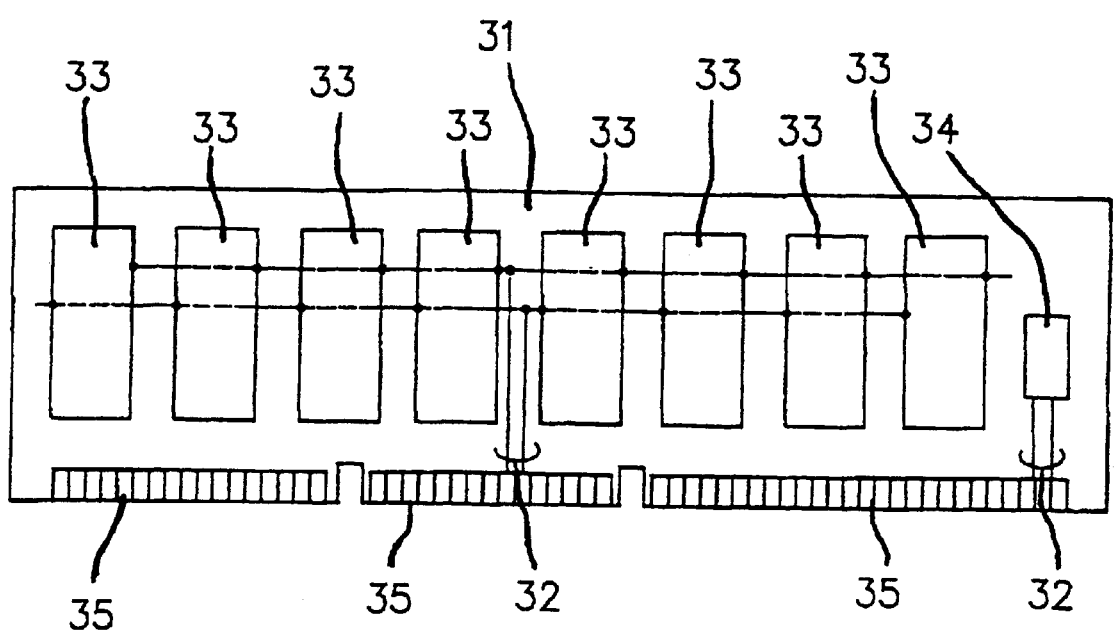
FIG. 1 is a front view illustrative of a conventional multilayer printed circuit board on which eight dynamic random access memories are mounted along with a single electrically erasable programmable read only memory.
Figure 2:
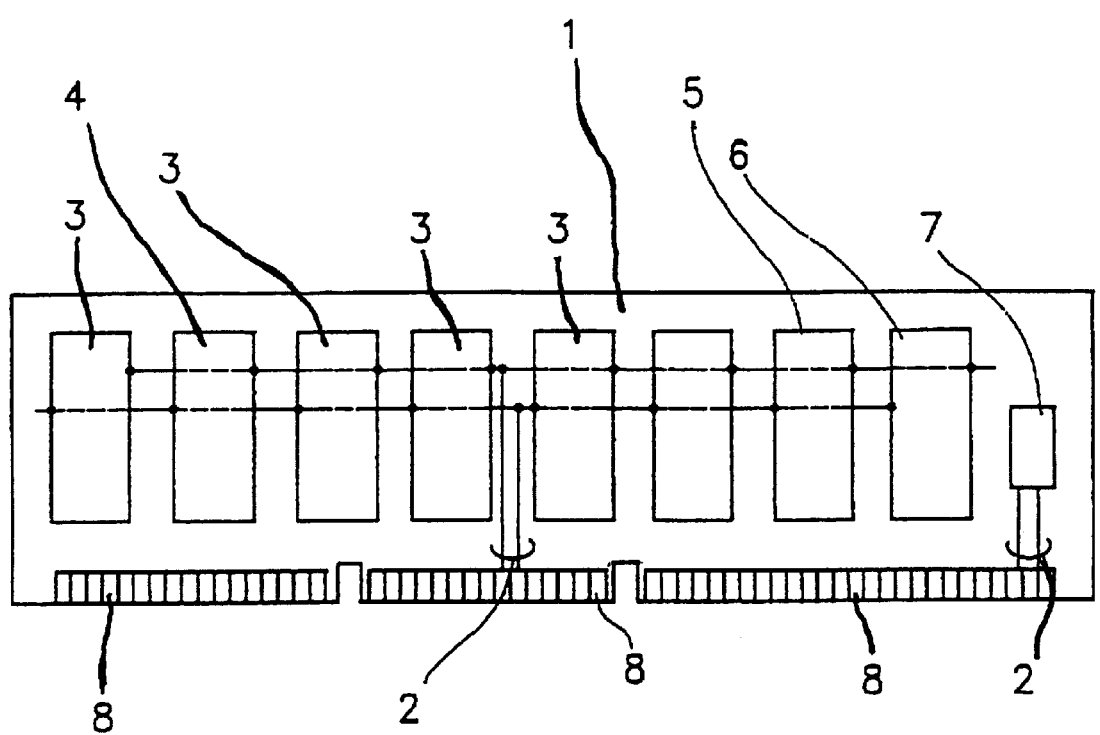
FIG. 2 is a front view illustrative of a novel memory module comprising a multilayer printed circuit board on which eight dynamic random access memories having defective addresses are mounted along with a single electrically erasable programmable read only memory storing informations of said defective addresses in a first embodiment in accordance with the present invention.

A first embodiment according to the present invention will be described in detail with reference to FIG. 2 which is illustrative of a novel memory module comprising a multilayer printed circuit board on which eight dynamic random access memories having defective addresses are mounted along with a single electrically erasable programmable read only memory for storing informations of the defective addresses whereby a central processing unit fetches the informations of the defective addresses so that the central processing unit is operated to inhibit an access to the defective addresses.

A multilayer printed circuit board 1 has a bottom side on which connective terminals 8 are provided so that the multilayer printed circuit board 1 is electrically and mechanically connected to the Mother board through sockets on the mother board. Eight dynamic random access memories 3, 4, 5 and 6 are mounted to be aligned in a lateral and longitudinal direction of the multilayer printed circuit board 1. Five dynamic random access memories 3 are free of any defective address. The dynamic random access memory 4 has a defective address corresponding to one bit. The dynamic random access memory 5 has defective addresses corresponding to one word or 128 bits, The dynamic random access memory 6 has defective addresses corresponding to one block or 131,072 bits. Each of the eight dynamic random access memories 3, 4, 5 and 6 may comprise the 64 M-bits dynamic random access memory. If the eight complete dynamic random access memories free of any defective address were mounted on the multilayer printed circuit board 1, this complete memory module has a capacity of 512 M-bits which means that 536,870,912 M-bits are actually present.

The individual eight dynamic random access memories 3, 4, 5 and 6 are electrically connected through a first set of interconnections 2-1 to the connective terminals 8. A single electrically erasable programmable read only memory 7 is also mounted on a side portion of the multilayer printed circuit board 1. The single electrically erasable programmable read only memory 7 is electrically connected through a second set of interconnections 2-2 to the connective terminals 8.

The dynamic random access memories have been checked by a tester in a checking process to detect any defective addresses, so that informations of the defective addresses and defective words as well as defective blocks have been detected prior to the forwarding of the dynamic random access memories. One defective word may be considered to be an alignment of the defective addresses. One defective block may be considered to be a set of the defective addresses. For this reason, the expression "defective addresses" means to include no; only a plurality of defective addresses but also any defective word and any defective block. Namely, the expression "at least one defective address" means to include one defective address, a plurality of defective addresses, at least one defective word and at least one defective block. The informations of the detected defective addresses have previously been written into the electrically erasable programmable read only memory 7. Namely, the electrically erasable programmable read only memory 7 may store not only the informations of the detected defective addresses but also the informations of the configuration and characteristics of the module. The memory module comprises the multilayer printed circuit board 1f the eight dynamic random access memories 3, 4, 5 and 6 as well as the electrically erasable programmable read only memory 7 which stores the informations of the detected defective addresses of the dynamic random access memories 4, 5 and 6. After the memory modules with the connective terminals 8 are inserted into the sockets on the mother board of the computer, the informations of the defective addresses stored in the electrically erasable programmable read only memory 7 can be fetched by the central processing unit so that the central processing unit is operable to inhibit any access to the defective addresses of the dynamic random access memories 4, 5 and 6. As a result, the above novel memory module is usable as having a capacity of 536,739, 711 bits which is less than 536,870,912 bits by a total bit number of the one defective address, the one defective word and the one defective block.

Further, the above memory module is preferably used as a semiconductor electronic disk for storing data in the computer system. The above memory module is not intended to be used as a system memory for storing programs of an operating system. The complete random access memories are used as the system memory for storing the programs of the operating system. The operating system in the non-volatile magnetic disk has been transferred into the system memory region upon switching ON of the computer system, before the central processing unit is operated to fetch the informations of the defective addresses of the dynamic random access memories so as to set write and read inhibitions to the defective addresses. This makes it possible to use the memory module having the random access memories including defective addresses except as the system memory. For example, even if the yield of the complete random access memories is only 70%, 20% of the defective random access memories may be used for the above novel memory module. This results in a reduction in price of the product and it is possible to realize an inexpensive memory module.

In accordance with the first embodiment of the present invention, the above novel memory module includes at least one defective random access memory having at least one defective address and an non-volatile memory for storing informations of the defective address so that the central processing unit is operable to fetch the informations of the defective address in order to set write and read inhibitions to the defective address. As a result, the above novel memory module is usable even having the defective random access memory including the defective address. This makes it possible to reduce the unit price of the memory module.

Since, further, the non-volatile memory for storing informations of the defective address comprises the electrically erasable programmable read only memory, it is possible to update the defective address data stored in the electrically erasable programmable read only memory if any. It is of course possible to update informations of the defective address which have been detected by a memory check function of the personal computer.

In place of the electrically erasable programmable read only memory, it is also possible to use other non-volatile memories such as erasable and programmable read only memory and programmable read only memory.

SECOND EMBODIMENT

Figure 3:
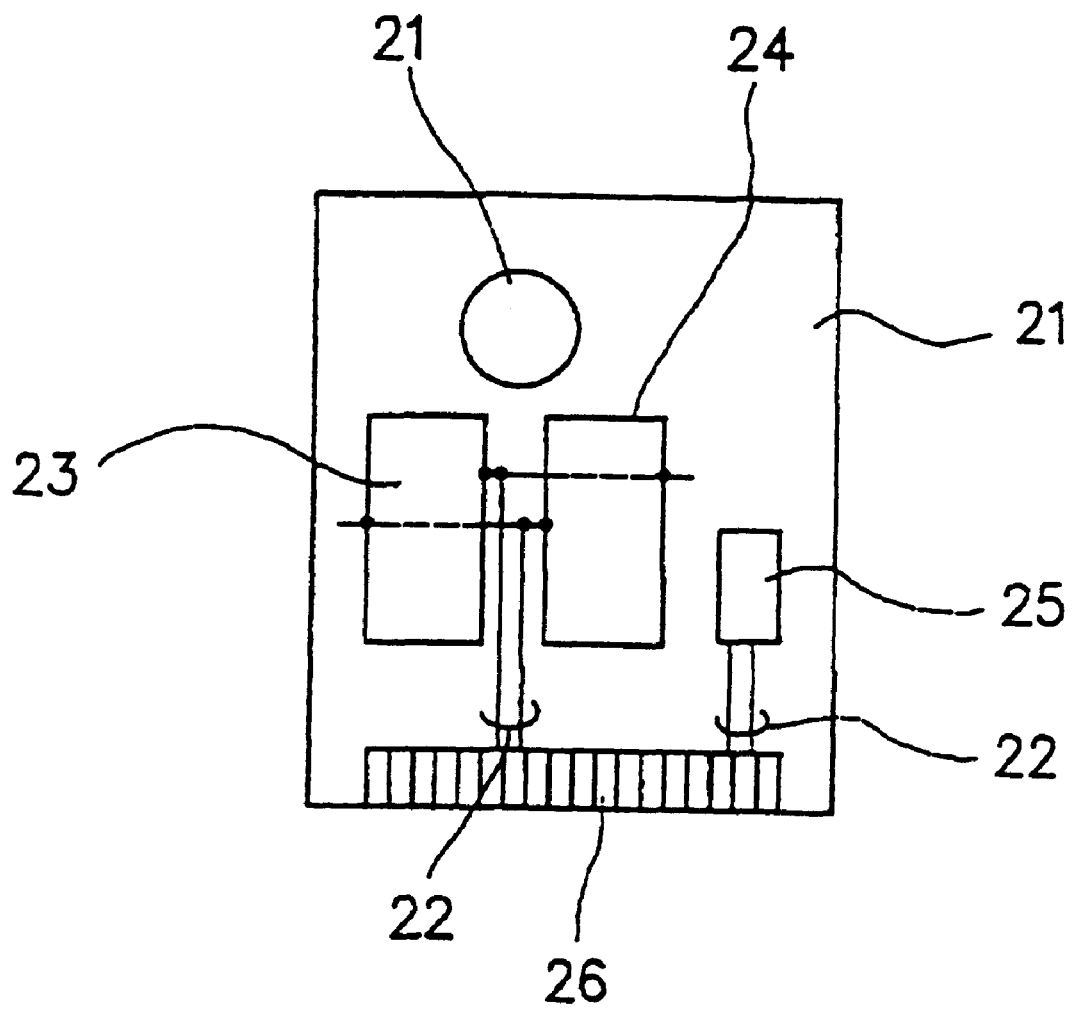
FIG. 3 is a front view illustrative of a novel memory module comprising a multilayer printed circuit board on which two static random access memories having detective addresses are mounted along with a single electrically erasable programmable read only memory storing informations of said defective addresses in a second embodiment in accordance with the present invention.

A second embodiment according to the present invention will be described in detail with reference to FIG. 3 which is illustrative of another novel memory module comprising a multilayer printed circuit board on which a complete static random access memory free of any defective address and a defective static random access memory having defective addresses are mounted along with a single electrically erasable programmable read only memory for storing informations of the defective addresses whereby a central processing unit fetches the informations of the defective addresses so that the central processing unit is operated to inhibit an access to the defective addresses.

A multilayer printed circuit board 21 has a bottom side on which connective terminals 26 are provided so that the multilayer printed circuit board 21 is electrically and mechanically connected to the mother board through socket on the mother board. Two static random access memories 23 and 24 are mounted on the multilayer printed circuit board 21. The static random access memory 23 is free of any defective address The static random access memory 24 has defective addresses.

The individual two static random access memories 23 and 24 are electrically connected through a first set of interconnections 22-1 to the connective terminals 26. A single electrically erasable programmable read only memory 25 is also mounted on a side portion of the multilayer printed circuit board 21. The single electrically erasable programmable read only memory 25 is electrically connected through a second set of interconnections 22-2 to the connective terminals 26. Further, a battery 27 is provided on the multilayer printed circuit board 21 so that if the memory module is removed from the computer system then the battery 27 allows the individual two static random access memories 23 and 24 to hold data. The static random access memories are advantageous in a small consumption current in stand-by state and in high speed performances.

The static random access memories have been checked by a tester in a checking process to detect any defective addresses, so that informations of the defective addresses and defective words as well as defective blocks have been detected prior to the forwarding of the static random access memories. The informations of the detected defective addresses have previously been written into the electrically erasable programmable read only memory 25. Namely, the electrically erasable programmable read only memory 25 may store not only the informations of the detected defective addresses but also the informations of the configuration and characteristics of the module. The memory module comprises the multilayer printed circuit board 21., the two dynamic random access memories 23 and 24 as well as the electrically erasable programmable read only memory 25 which stores the informations of the detected defective addresses of the static random access memory 24. After the memory modules with the connective terminals 26 are inserted into the sockets on the mother board of the computer, the informations of the defective addresses stored in the electrically erasable programmable read only memory 25 can be fetched by the central processing unit so that the central processing unit is operable to inhibit any access to the defective addresses of the static random access memory 24

In accordance with the second embodiment of the present invention, the above novel memory module includes at least one defective random access memory having at least one defective address and an nonvolatile memory for storing informations of the defective address so that the central processing unit is operable to fetch the informations of the defective address in order to set write and read inhibitions to the defective address. As a result, the above novel memory module is usable even having the defective random access memory including the defective address. This makes it possible to reduce the unit price of the memory module.

Since, further, the non-volatile memory for storing informations of the defective address comprises the electrically erasable programmable read only memory, it is possible to update the defective address data stored in the electrically erasable programmable read only memory if any. It is of course possible to update informations of the defective address which have been detected by a memory check function of the personal computer.

In place of the electrically erasable programmable read only memory, it is also possible to use other non-volatile memories such as erasable and programmable read only memory and programmable read only memory.

The static random access memories are advantageous in a small consumption power in stand-by state and in high speed performances as well as holding data either after a power to the computer system has turned OFF or after the memory module has been removed from the computer system.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims air modifications which fall within the spirit and scope of the present invention.

What is claimed is:

1. A memory module having connective terminals and semiconductor electronics, the semiconductor electronics consisting of a plurality of random access memories and a programmable read-only memory, wherein the random access memories are connected through a first set of interconnections to said connective terminals, at least one of said random access memories having at least one defective address, the programmable read-only memory being connected through a second set of interconnections to said connective terminals for storing information pertaining to said at least one defective address so as to allow a processing unit to fetch said information of said at least one defective address from said storage means so that said processing unit is operated to inhibit an access to said at least one defective address.

2. The memory module as claimed in claim 1, wherein said random access memory comprises at least one volatile static memory module.

3. The memory module as claimed in claim 2, further comprising a battery electrically connected to said at least one volatile static memory module for allowing said volatile static memory to hold information stored therein.

4. The memory module of claim 1, wherein the memory module is free of a logic device which redirects memory accesses to the memory locations whose addresses are contained in the programmable read-only memory.

5. The memory module of claim 4, wherein the programmable read-only memory is electrically connected only to the connective terminals.

6. The memory module of claim 1, wherein the programmable read-only memory is electrically connected only to the connective terminals.

7. A memory subsystem for a computer, comprising:

a memory module comprising a printed circuit board having an edge connector to which a plurality of semiconductor components are attached, the semiconductor components consisting of:

a plurality of random access memory devices electrically connected to the edge connector, at least one of the random access memory devices having at least one defective memory location; and a programmable read-only memory device electrically connected to the edge connector and containing address information identifying the at least one defective memory location; and a system CPU located off of the printed circuit board and connected by a bus to the memory module, the CPU comprising means for reading the defective address information from the programmable read-only memory and inhibiting access to the memory locations identified by the addresses stored in the programmable read-only memory.

8. The memory subsystem of claim 7, wherein the defective memory locations are addressable from the edge connector.

9. A method for performing CPU accesses to a memory module, wherein the memory module comprises at least one random access memory component containing at least one defective memory location, the memory module also comprising a programmable read-only memory, the method comprising the steps of:

programming the programmable read-only memory with address information identifying the at least one defective memory location;

performing a CPU read of the defective address information contained in the programmable read-only memory; and setting the CPU to inhibit access to the at least one defective memory location identified by the at least address read into the CPU.

10. The method of claim 9, wherein the CPU reading step is performed only after operating system programs have been loaded from a nonvolatile storage medium to a fully functional memory module separate from the memory module containing the at least one defective memory location, the fully functional memory module containing no defective memory locations.

* * * * *